(12) United States Patent
Lackey et al.

(10) Patent No.: US 9,001,857 B2
(45) Date of Patent: Apr. 7, 2015

(54) HIGH-EFFICIENCY, DUAL CURRENT SINK LASER DIODE DRIVER

(75) Inventors: Michael S. Lackey, Torrance, CA (US);
Thomas H. Alford, Lomita, CA (US);
Robert F. Stiffler, Lakewood, CA (US);
David Filgas, Newbury Park, CA (US)

(73) Assignee: Raytheon Company, Waltham, MA (US)

( * ) Notice: Subject to any disclaimer, the term of this patent is extended or adjusted under 35 U.S.C. 154(b) by 47 days.

(21) Appl. No.: 13/215,873

(22) Filed: Aug. 23, 2011

(65) Prior Publication Data

US 2013/0051415 A1     Feb. 28, 2013

(51) Int. Cl.
*H01S 3/00*     (2006.01)
*H03K 3/57*     (2006.01)

(52) U.S. Cl.
CPC ........................................ *H03K 3/57* (2013.01)

(58) Field of Classification Search
CPC ................................. H01S 5/042; H03K 3/57
USPC ........ 372/29.012, 38.02, 38.04, 38.06, 38.07; 250/205; 345/46, 82, 212
See application file for complete search history.

(56) References Cited

U.S. PATENT DOCUMENTS

| | | | |
|---|---|---|---|
| 4,104,533 A * | 8/1978 | Iverson | 250/551 |
| 5,111,065 A | 5/1992 | Roberge | |
| 2006/0239307 A1 | 10/2006 | Nakao et al. | |
| 2006/0291512 A1* | 12/2006 | Borschowa | 372/38.02 |
| 2009/0219964 A1 | 9/2009 | Yossi et al. | |
| 2009/0296759 A1 | 12/2009 | Starodoumov | |
| 2012/0038285 A1* | 2/2012 | Leung et al. | 315/193 |

* cited by examiner

*Primary Examiner* — Julio J Maldonado
*Assistant Examiner* — Joshua King
(74) *Attorney, Agent, or Firm* — Burns & Levinson, LLP; Joseph M. Maraia

(57) ABSTRACT

Provided are assemblies and processes for activating light emitting devices. A first current sink is in electrical communication with a common source through a current node and configured to draw a first current through the current node in response to a respective control signal. A second current sink is also provided in electrical communication with the current node and in parallel with the first current sink, also configured to draw a second current through the current node in response to a respective control signal. An aggregate current is drawn through the array, determined as a combination of the first and second currents. A commanded current from the first current sink can be shunted around the second array and the second current sink, providing a capability to series both the first and second laser diode light-emitting arrays, while simultaneously drawing different current amplitudes through each array from a common potential source.

16 Claims, 10 Drawing Sheets

HIGH-EFFICIENCY, DUAL CURRENT SINK LASER DIODE DRIVER

TECHNICAL FIELD

Various embodiments are described herein relating generally to the field of activating laser diodes and the like, and more particularly to driving laser diodes in master oscillator (MO), power oscillator (PO), and optical power amplifier (PA) applications.

BACKGROUND

Power scaling of a laser refers to increasing a laser's output power without substantially changing the geometry, shape, or principle of operation. Power scalability is considered an important advantage in a laser design. Usually, power scaling requires a more powerful pump source, stronger cooling, and an increase in size. It may also require reduction of the background loss in the laser resonator and, in particular, in the gain medium. One such approach for achieving power scalability is referred to as a "MOPA" (Master Oscillator Power Amplifier). A MOPA includes a master oscillator (MO) e.g., a stable, low power laser source producing a highly coherent beam, which provides an input, or seed to an optical power amplifier (PA). The optical PA increases the power of the "seed" beam, while generally preserving its main properties. Consequently, the MO has no need to be powerful, and no need to operate at high efficiency because the efficiency is determined largely by the PA. The MO is normally not used as a standalone entity, because of its low output. However, by seriesing multiple laser diodes in a light emitting array (i.e., 5 10, or more diodes) to pump a single gain medium; a "power oscillator" (PO) is created. The PO is conceptually the same as a MO; but with significantly more laser light output power. The PO is nothing more than a high power MO that is suitable for medium power applications like near earth range finding. The PO usually has a smaller output than a MOPA. A MOPAPA can be created in which the $1^{st}$ PA creates seed light for the $2^{nd}$ PA. By continually adding more and larger PAs to the chain kilowatt or even megawatt laser outputs are possible.

Generally, optical PAs include a gain medium. The gain medium comprises a host material which contains a particular concentration of dopant ions. An optical pumping source (e.g., a laser diode array) excites dopant ions of the gain medium to a higher energy state from which they can decay, via emission of a photon at the signal wavelength back to a lower energy level. Photonic emission may be spontaneous or stimulated, in which such transition of a dopant ion is induced by another photon. Preferably, pumping of the gain medium is sufficient to achieve a population inversion, in which more ions exist in an excited state than a lower energy state. Stimulated emission is induced within the gain medium by incoming light introduced in the form of a seed beam. Example structures include doped optical fiber waveguides, rods, slabs, and planar waveguide.

Pumping such optical systems generally requires a substantial amount of energy. For example, when such pumping is accomplished using laser diodes, the diodes are driven at current levels that can reach into the hundreds of Amperes. Laser drive currents for pumping a gain medium can be both single pulse and periodic in nature. Typically, the pulses are provided periodically, for short durations, followed by an off or no current period. Suitable laser diode currents for pumping MOs and PAs can be provided by laser diode driver circuits. Traditionally, in such MOPA configurations, two fully independent current driver circuits are generally provided, one for the PA laser diode array and another for the MO laser diode array. Each current driver circuit generally contains its own separate charge source, such as a storage capacitor. In operation, such current driver circuits are configured to provide rectangular current pulses (i.e., on/off, current/no current).

SUMMARY

Described herein are embodiments of systems and techniques for activating light emitting devices, such as laser diodes, as may be used in connection with an optical PA or MO or PO. Multiple PAs can be used with a single MO to further enhance the output energy of a MOPA system. The light emitting devices referred to herein may be configured as a single optical emitter or an array of optical emitters arranged in a series, parallel, or parallel sets of series connected optical emitters. For the purpose of simplicity, these light emitting devices will be referred to as light emitting arrays but could, in practice, be in any of the afore mentioned arrangements.

In one aspect, at least one embodiment described herein provides a multi-stage laser drive circuit configured to draw current from a common potential source. The drive circuit includes a current node (a current node is defined here to be a particular voltage node through which current flows) and a first light-emitting array in electrical communication between the common potential source and the current node. The drive circuit also includes first and second current sinks in electrical communication with the current node and in a parallel arrangement with respect to each other. The first current sink has a first control terminal and is configured to draw a first current from the common potential source, through the current node, in response to a respective current control output signal received at the first control terminal. Likewise, the second current sink has a second control terminal and is configured to draw a second current from the common potential source, through the current node, in response to a respective current control output signal received at the second control terminal. An aggregate current drawn through the first light-emitting array is determined substantially by a combination of the first and second currents. The first light-emitting array is further configured to emit light in response to current drawn therethrough.

In some embodiments, the multi-stage laser drive circuit further includes at least one current-drive circuit. The current-drive circuit has a current-enable input, a current-level setting input and a current control output. The current control output is in electrical communication with one of the first and second control terminals of the two current sinks. The current-drive circuit is configured to selectively provide a respective current control output signal in response to a signal received at the current-enable input. The respective current control output signal, when provided, is further determined by a signal received at the current-level setting input.

In some embodiments, the multi-stage laser drive circuit further includes a second light-emitting array (e.g., an MO or additional PA light-emitting array). This second light-emitting diode array is in electrical communication with the second (MO) current sink, such that current drawn through the light-emitting array is substantially determined by the 2nd current (MO current sink). The MO light-emitting diode array is configured, in turn, to emit light in response to current drawn therethrough. The second light-emitting array includes at least one light-emitting device.

In some embodiments, at least one said light-emitting device becomes an optical pumping source for the gain medium being illuminated.

In some embodiments, the multi-stage laser drive circuit further includes a controller. The controller, when provided, is in electrical communication with the current-enable and current-level setting inputs of the at least one current drive circuits. The controller is configured to provide a current-enable signal to the current-enable input and a current-level setting signal to the current-level setting input.

In some embodiments, the multi-stage laser drive circuit further includes at least one current sensing device in electrical communication with a respective one of the first and second current sinks and with the controller. The current sensing device is configured to provide a respective output signal indicative of a respective current drawn therethrough.

In another aspect, at least one embodiment described herein relates to a process for driving a first light-emitting array. The process includes receiving first and second current control signals. A first current is drawn from a common potential source through a current node in response to the received first current control signal. A second current is drawn from the common potential source through the current node in response to the received second current control signal. The first and second currents are in parallel with respect to each other. An aggregate current is drawn through a first light-emitting array. The aggregate current is determined substantially by a combination of the first and second currents ($I_{MO}+I_{PA}$), wherein the light-emitting array emits light in response to the aggregate current drawn therethrough.

In some embodiments, the process further includes receiving a current-enable signal into the current-drive circuit. The current-enable signal includes at least two states, corresponding to "active" (i.e., drawing current) and "standby" (i.e., not drawing current). A current-level setting signal is also received, and at least one of the first and second current control output signals is determined in response to the received current-enable and current-level setting signals. In some embodiments, the received current-level setting signal varies while the current-enable signal is in the active state. This allows for Arbitrary Waveform Generation (AWG) of each current sink pulse. The respective one of the first and second currents is selectively drawn responsive to the current-enable signal being in the active state.

In some embodiments, the process further includes emitting light from a second light-emitting array in response to the first current.

In some embodiments, the process can include pumping a laser gain medium by light emitted from at least one said light-emitting arrays.

In some embodiments, the current-level setting signal for the current-drive circuit includes a momentary peak configured to induce a momentary peak output current for at least one said light-emitting arrays. Such a momentary peak is adapted to optically excite the gain medium being pumped, thereby providing synchronization of the optical excitation with respect to the laser output.

In yet another aspect, at least one embodiment described herein provides a MOPA laser optical pumping system, including means for receiving first and second current control signals. Means for drawing a first current from a common potential source through a current node in response to the received first current control signal and means for drawing a second current from the common potential source through the current node in response to the received second current control signal, are also provided. The first and second currents are in parallel with respect to each other. The MOPA current source also includes means for drawing an aggregate current through a first light-emitting array, means for emitting first pump light in response to the aggregate current ($I_{MO}+I_{PA}$), and means for communicating first pump light into a power amplifier (PA) gain medium. The aggregate current is determined substantially by a combination of the first and second currents, wherein the light-emitting device emits light in response to the aggregate current drawn therethrough.

In some embodiments, the MOPA laser optical pumping system further includes means for drawing said $2^{nd}$ current through a second light-emitting array, wherein the light emitting array emits light in response to the current drawn therethrough ($I_{MO}$). Means for emitting second pump light in response to the $2^{nd}$ current ($I_{MO}$) and means for communicating $2^{nd}$ pump light into a MO gain medium are also provided.

The number of current sinks and control terminals for said current sinks can be three, four, five, or more current sinks in parallel to increase aggregate current capacity and to improve overall aggregate reliability. Only two current sinks will be discussed in the remainder of this document for simplicity. Additionally, the current sinks could just as easily been designed as current sources located between the common potential source and the top first and second light-emitting arrays. An actual design was completed and simulated using 6 current sinking circuits in parallel.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

A description of embodiments of systems and processes for activating light emitting devices, such as laser diodes, as may be used in connection with an optical amplifier follows. More particularly, a laser diode drive circuit is provided with at least two controllable low-side current sinks (or two high-side current sources). Each current sink can be operated to control current drawn from a common shared source, such as a storage capacitor, through pumping laser diodes. In some embodiments, each of the two current sinks draws a respective portion (e.g., half) of the total laser diode drive current, thereby reducing the current load of either current sink. Operating components, such as the current sinks, at reduced current levels allows for lower temperature operation thereby improving device and overall system reliability.

In other embodiments, one of the current sinks is operated to draw a relatively high, first current through a first laser diode array configured to pump an optical gain medium. Another of the current sinks is operated to draw a relatively lower current through a second laser diode array to pump a laser MO which in turn provides an optical seed signal. Such a seed output is applied to and amplified by the optical gain medium, suitably pumped by the first laser diode array. In particular, both laser diode arrays are operated in a series arrangement. Such an arrangement allows for sharing a common storage capacitor. Such sharing results in less components (i.e., one storage capacitor and charging circuit) thereby offering improved efficiency over prior arrangements using independent storage capacitors.

Figure 1:
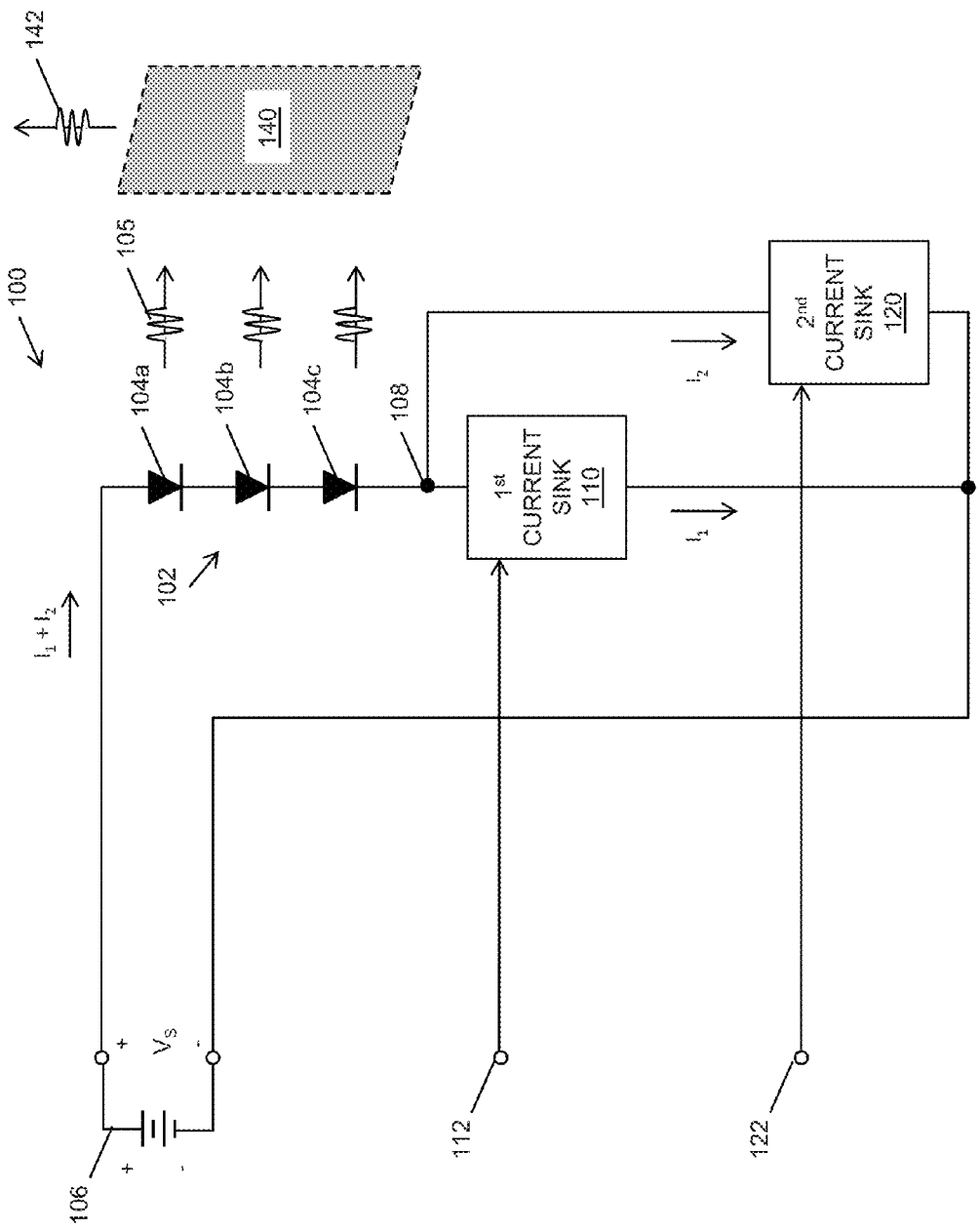
FIG. 1 illustrates a block diagram overview of an embodiment of a multi-stage laser diode driver driving a single light emitting diode array with two paralleled current sinks. This is an example of the power oscillator (PO) topology.

A block diagram overview of an embodiment of a multi-stage laser diode driver 100 (PO) is shown in FIG. 1. The laser diode driver 100 includes a first light-emitting array 102. In the illustrative embodiment, the light-emitting array 102 is series-coupled, including three semiconductor devices, such as laser diodes 104a, 104b, 104c (generally 104), arranged in series with respect to each other. One end of the laser diodes 104 is in electrical communication with a first terminal of a common potential source 106. The common potential source 106 can be any suitable source providing sufficient electrical charge to support an electrical current of a sufficient magnitude through a circuit including the laser diodes 104. Some examples include a battery, a storage capacitor, and a power supply. The opposite end of the series-coupled laser diodes 104 is in electrical communication with a current node 108.

A first current sink 110 is in electrical communication between the current node 108 and an opposite (negative) terminal of the common potential source 106, thereby completing a circuit. The first current sink 110 is arranged to draw a first current $I_1$ from the common potential source 106 through the current node 108. In the illustrative embodiment, the first current sink 110 has a first control terminal 112 adapted to receive a respective current control output signal. A second current sink 120 is in electrical communication between the current node 108 and an opposite (negative) terminal of the common potential source 106. The second current sink 120 is also arranged to draw a second current $I_2$ from the common potential source 106 through the current node 108. In the illustrative embodiment, the second current sink 120 has a first control terminal 122 also adapted to receive a respective current control output signal. The first and second current sinks 110, 120 are arranged in parallel with respect to each other. Being positioned in a third independent circuit leg to the current node, a current drawn through the light-emitting array 102 is a sum of the currents drawn by each of the current sinks 110, 120 (i.e., $I_1+I_2$). The series-coupled laser diodes 104 preferably emit light 105 in response to the aggregate current $I_1+I_2$ drawn therethrough.

Figure 4:
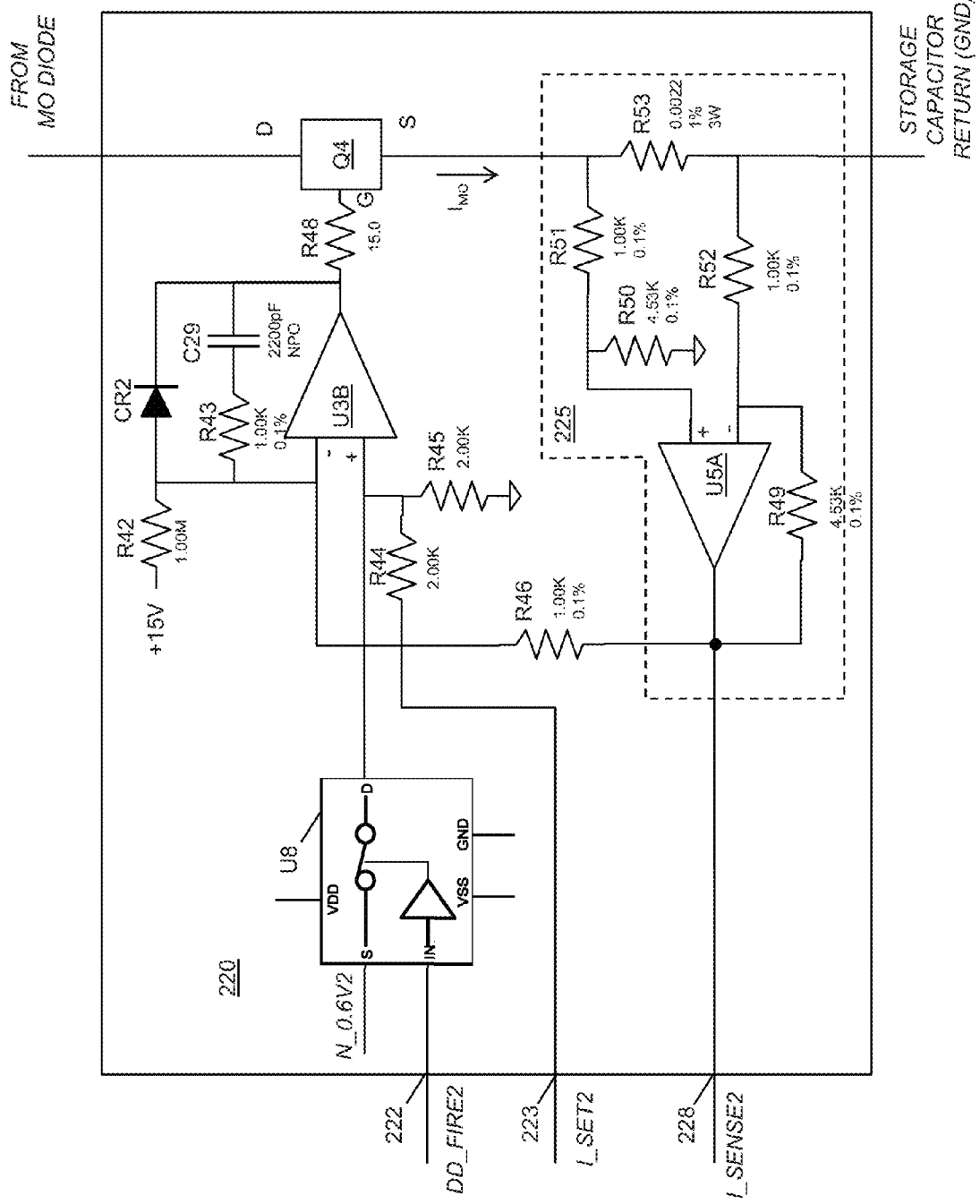
FIG. 4 illustrates a schematic diagram of an embodiment of a current sink circuit portion of a multi-stage laser diode driver with the current sense feedback included.

Each of the current sinks 110, 120 draws a respective contribution of electrical current through the node 108 in response to stimulus at its respective control terminal 112, 122. Even though the term current "sink" is used in the illustrative examples described herein, it can be replaced or otherwise referred to as a current "source." The designation sink or source depends upon perspective. In the case of a high-side current source implementation, the dual current sources is moved in between the common potential source 106 and the light-emitting array 102. The bottom of the light-emitting array is then tied to the negative terminal of the common potential source 106. At least one advantage offered by using high-side current sources (instead of low-side current sinks) is improved diode array protection, for example, from short circuits to ground, however, at the cost of greater circuit complexity. In a simplistic embodiment, each of the current sinks 110, 120 can be provided by a series combination of a resistor and a single-pole/single-throw (SPST) analog, or mechanical switch. Operation of such a switch can be accomplished by stimulus received at the respective control terminal 112, 122, for example by operation of a solenoid or other suitable actuator. It is contemplated that in some embodiments electronic switches, such as transistors can be used in place of the analog switch. Control of such electronic switches can be accomplished by stimulus received at the respective control terminal (e.g., a gate voltage). When the switch is open, no current is drawn by the respective current sink 110, 120. When either switch is closed, a respective current is drawn through the respective resistor. The magnitude of current drawn would be determined at least in part according to the electrical circuit traced through the common potential source and laser diodes 104 and the value of the resistor. In such configurations, the control terminal stimulus operates the current sink in a binary fashion, the current being either on or off according to the stimulus. In at least some embodiments, the circuit design is not a simple switch but rather a linear, closed-loop servo system, as shown in FIG. 4.

It is also contemplated that any of the current sources or sinks described herein, such as the two current sinks 110, 120 of the illustrative example, can include a controllable current source, in which a current magnitude drawn by the current sink 110, 120 is determined by a voltage and/or current stimulus provided at the respective control terminal 112, 122. Such controllable current sinks 110, 120 can include one or more active elements, such as transistor devices. In a particular embodiment, at least one of the current sinks 110, 120 includes a power metal oxide semiconductor field effect transistor (MOSFET), such as part no. IRFP4368PbF, HEXFET® power MOSFET, commercially available from International Rectifier of El Segundo, Calif. In such a device, the drain-to-source current $I_{DS}$ is controllable by the gate-to-source voltage $V_{GS}$, the device being capable of sinking a drain-to-source current $I_{DS}$ of over 250 Amperes at a gate-to-source voltage $V_{GS}$ of 10 Volts.

In laser power scaling applications, light 105 emitted by the laser diodes 104 can be coupled into an optical gain medium 140. Preferably, wavelength of light 105 emitted from the laser diodes 104 resides within a suitable band and has sufficient amplitude to "pump" ions of the gain medium 140 to an elevated energy state. Such pumping can be accomplished with one or more pulses of radiant energy from the laser diodes 104. Under such a pumping mode, the electrical current drawn through the diodes 104 corresponding to a pumping current $I_{PA} = I_1 + I_2$. Typically, $I_{PA}$ is an appreciable current (e.g., one hundred Amperes or more) being sufficient to cause laser diodes 104 to emit optical energy sufficient to pump the optical gain medium 140 and emit laser light 142. Since the first and second currents $I_1$, $I_2$ are additive, each can be less than the power amplifier current. For example, each current can be substantially equal, being one-half of the power amplifier current. At least some benefits realizable with such power sharing is reduced operating temperature and more generally, reduced stress on electronic components, such as the first and second current sinks 110, 120. Reduced electronic component stress translates to improved system reliability. Other embodiments are possible having more than two current sinks arranged in parallel to further share the total laser current load on each of the current sink modules. Although only two current sinks are shown in FIG. 1, it is contemplated that more than two can be used, particularly in view of constant current sinks/sources being high-impedance entities that are well suited to sharing current. In this case each current sink/source added contributes to the overall aggregate current through the light-emitting diode array at 102.

Figure 2:
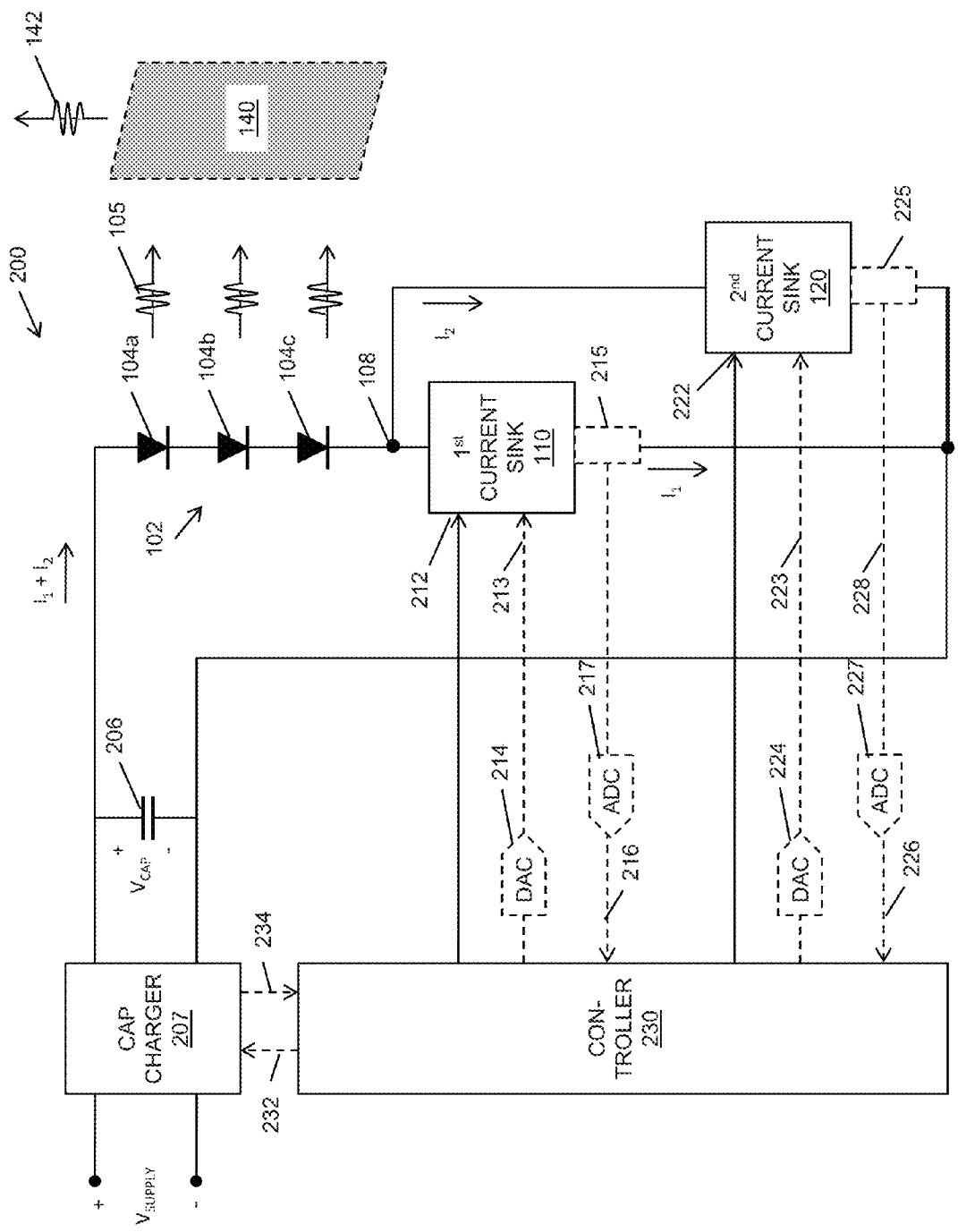
FIG. 2 illustrates a block diagram overview of another embodiment of a multi-stage laser diode driver similar to that illustrated in FIG. 1, providing more detail as to how the diode driver is powered and controlled.

A block diagram overview of another embodiment of a multi-stage laser diode driver is shown in FIG. 2. Once again, the laser diode driver 200 includes a first light-emitting array 102. In the illustrative embodiment, the light-emitting array 102 is series coupled, including three semiconductor devices, such as laser diodes 104a, 104b, 104c (generally 104), arranged in series with respect to each other. One end of the series-coupled laser diodes 104 is in electrical communication with a first terminal of a common potential source 206. The common potential source 206 in this example is provided by a storage capacitor 206. A capacitor charging circuit 207 is in electronic communication with the storage capacitor 206 and configured to charge the capacitor to a preferred voltage level $V_{CAP}$ at least during periods of charging. The capacitor charging circuit 207 is generally powered by another source, such as a power supply $V_{SUPPLY}$ (e.g., an alternating or direct current power supply or facility power).

A first current sink 110 is in electrical communication between the current node 108 and an opposite (negative) terminal of the storage capacitor 206. The first current sink 110 is arranged to draw a first current $I_1$ from the storage capacitor 206 through the current node 108. Once again, the first current sink 110 also has a first control terminal 212 adapted to receive a respective current control output signal. A second current sink 120 is in electrical communication between the current node 108 and an opposite (negative) terminal of the storage capacitor 206. The second current sink 120 is arranged to draw a second current $I_2$ from the storage capacitor 206 through the current node 108. In the illustrative embodiment, the second current sink 120 has a first control terminal 222 also adapted to receive a respective current control output signal. The first and second current sinks 110, 120 are arranged in parallel with respect to each other. Each of the current sinks 110, 120 operates as described above in relation to FIG. 1, e.g., drawing a current in response to a respective control stimulus (e.g., a control voltage).

In some embodiments, one or more of the current sinks 110, 120 includes a respective second control terminal 213, 223. Each of the second control terminals 213, 223 is configured to receive a current-level control signal corresponding to a preferred current level to be drawn by the respective current sink 110, 120. More generally, in at least some embodiments, a current-level control signal also controls a pulse shape of current to be drawn through the respective current sink 110, 120. In such embodiments, each of the current sinks 110, 120 is configured to draw a current during periods of stimulus at its respective first control terminal 212, 222, such that the magnitude of current drawn (constant or time-varying) corresponds to the respective current-level control signal received at its respective second control terminal 213, 223. In particular, variation of either current-level control signal during periods in which a current is being drawn results in the value of drawn current varying with respect to time. It is contemplated that, in general, any arbitrary pulse shape to current drawn through either current sink 110, 120 may be obtained. Examples include rectangular pulses, ramp pulses, triangular pulses, stepped pulses, combinations of such pulses, and the like.

The laser diodes 104 emit light 105 in response to an electrical current drawn thereto. In the exemplary embodiment, the current value is the combination $I_T = I_1 + I_2$. As described above, pumping an optical amplifier requires appreciable power, such that the total current $I_T$ may be 100 Amperes or more. Beneficially, either current sink 110, 120 need only draw a portion of the total current (e.g., $I_T/2$), allowing the devices 110, 120 to run at lower currents, also generating less heat. Consequently, overall reliability of the laser diode driver 200 can be improved. Emitted light 105 can be used to pump an optical gain medium 140, such that an amplified optical output 142 is produced through stimulated emission.

In at least some embodiments, the laser diode driver 200 includes a controller 230. The controller 230 is in electrical communication with at least the first control terminal 212, 222 of each current sink 110, 120. The controller 230 is adapted to provide a stimulus (e.g., a voltage) to each of the current sinks 110, 120 causing each current sink to draw a respective electrical current to achieve desired operation of the laser diodes 104. Such stimulus may include, for example, a rectangular pulse distinguishing between current and no current states. Such stimulus may be pre-programmed, or otherwise configured to provide desired pulse durations at a desired duty cycle.

For embodiments in which either of the current sinks 110, 120 includes a second control terminal 213, 223, the controller can also be in electrical communication therewith and configured to provide the respective current-level control signal. Once again, such stimulus may be pre-programmed or otherwise configured to provide for the desired current pulse shape. In at least some embodiments, the controller 230 provides a numeric (e.g., digital) stimulus. For embodiments in which either current sink 110, 120 is configured to receive an analog current-level signal, a respective digital-to-analog converter (DAC) 214, 224 is provided (shown in phantom) to convert a digital control signal to an analog signal, such as a voltage or a current.

In some embodiments, the laser diode driver 200 includes one or more current sensors 215, 225. In the illustrative embodiments, a respective current sensor 215, 225 is provided in each leg of the circuit including a respective current sink 110, 120. In such a configuration, each current sensor 215, 225 is configured to sense a respective current drawn from the node 108. For example, the current sensor may be an inductive current sensor measuring current through an inductive field, or a precision resistor (e.g., 2.2 milliohms) shunted with a voltage sensor measuring a voltage across the precision resistor indicative of the current. A respective output 216, 226 of each sensor 215, 225 can be coupled to the controller 230. For embodiments in which the sensor output is an analog signal and the controller 230 is adapted to process digital values, a respective analog-to-digital (ADC) converter 217, 227 can be provided (shown in phantom) between a respective current sensor 215, 225 and the controller 230. In some embodiments, the sensed current can be used by the controller 230 in a feedback loop configuration with the current-level control signals 213, 223 to more precisely control the value of current drawn by each current sink 110, 120.

It is contemplated that in at least some embodiments, the controller 230 is in further communication with the capacitor charging circuit 207. For example, the controller 230 can provide a charge control signal 232 (shown in phantom) to the charger 207 for controlling charging of the storage capacitor 206. Such signal may control a rate of charging, or a voltage applied to the charge capacitor 206. Alternatively or in addition, the controller 230 can receive a charge status signal 234 (shown in phantom) from the charger 207, for example, indicative of a state of the storage capacitor 206 (e.g., fully charged, or a voltage level). The controller can be implemented on or otherwise configured for operation with a computer adapted to execute a set of pre-programmed instructions. Alternatively or in addition, the controller can be implemented in whole or in part by a field programmable gate array (FPGA).

Figure 3:
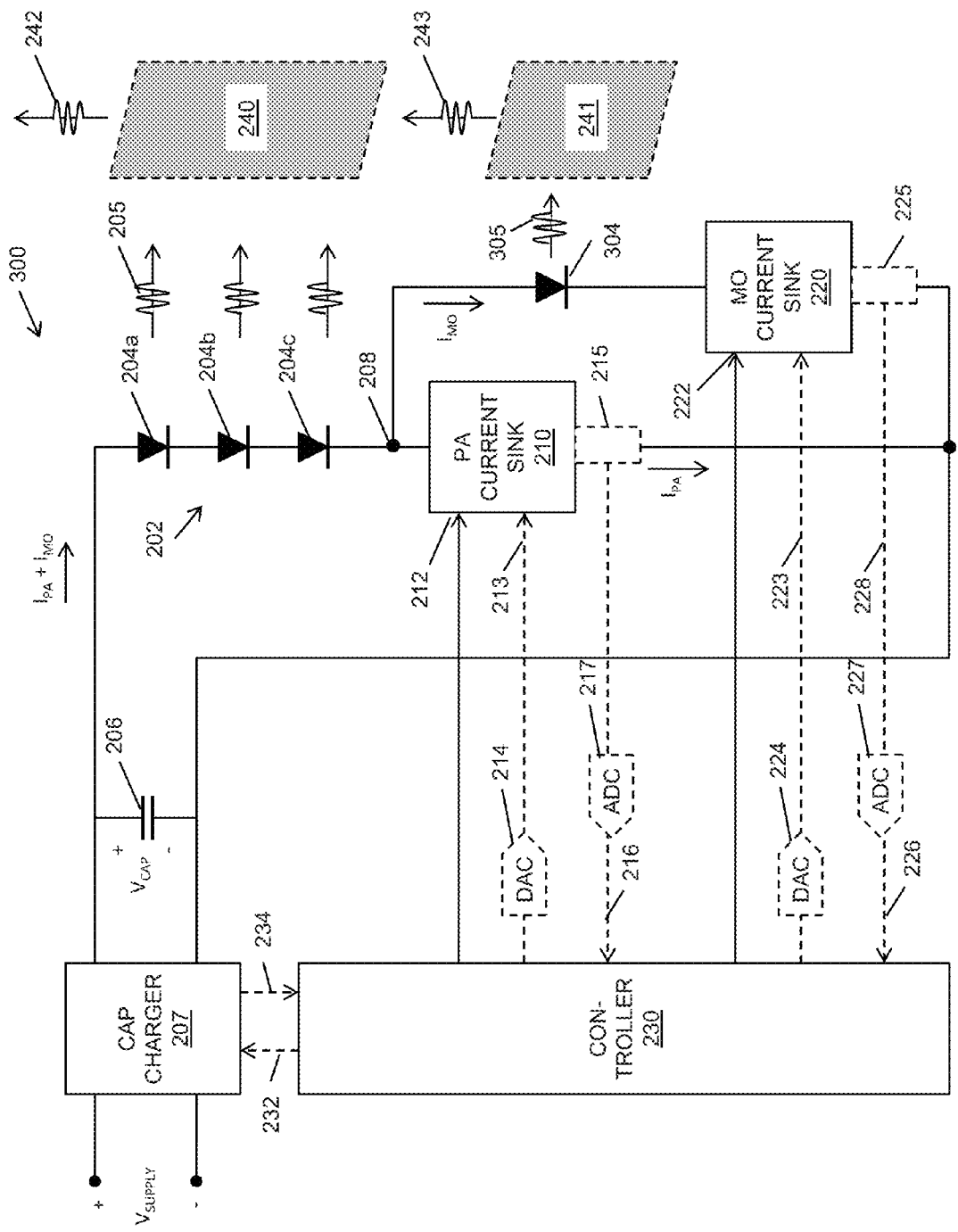
FIG. 3 illustrates a block diagram overview of yet another embodiment of a multi-stage laser diode driver, illustrating how a MO diode array and a PA diode array are driven in tandem from a common potential source. This is an example of the Master Oscillator Power Amplifier (MOPA) topology.

A block diagram overview of yet another embodiment of a multi-stage laser diode driver 300 is shown in FIG. 3. The driver 300 is similar in all respects to the driver 200 described above in FIG. 2, except for a second laser diode array 304 (MO diode array) coupled in series with one of the current sinks (MO current sink 220). In particular, in such an embodiment, the first current sink (PA current sink 210) and the second current sink (MO current sink 220), can be arranged to draw a power amplifier (PA) pumping current $I_{PA}+I_{MO}$ from the storage capacitor 206 through the PA light-emitting array 202 and into the current node 208. The resulting diode laser light 205 pumps the PA gain medium 240 until laser light is emitted 242. The second current sink 220 (MO current sink), can be referred to as a master oscillator (MO) current sink 220, because it creates the current through the MO diode array that emits the diode laser light 305 that pumps up the MO gain medium 241. The resulting seed light 243 from the MO gain medium 241 is the optical drive frequency for the PA gain medium 240. An example would be if it was desired to set the PA diode array current to 200 amps and the MO diode array current to 150 amps (considering that in a planar waveguide the MO current is generally equal to or less than the PA current). Thus, the MO current sink is commanded to 150 amps by inputs 222 and 223 and the PA current sink is commanded to 50 amps by inputs 212 and 213. The beauty of this approach is that both laser diode arrays are seriesed and powered from a single common potential source. In at least some embodiments, the MO diode array 304 is capable of producing an amplified pulse through stimulated emission of suitably pumped ions in the MO gain medium 241. In this instance, the seed light pulse is the pulse that comes out of the MO gain medium 243 and drives the PA gain medium 240.

Although a single laser diode 304 is illustrated, it can be replaced by an array of one or more laser diodes 304 arranged in series. Preferably, all of the diodes 204, 304 are arranged to emit light in response to electrical currents having common direction. In particular, such an arrangement provides for a greater number of laser diodes 204, 304 being arranged in series with a common storage capacitor 206, thereby providing an improved efficiency over traditional MOPA laser diode drivers in which PA and MO laser diodes are driven independently.

With the various techniques and circuit topologies described herein, it is possible to command current from a first controllable current sink (e.g., PA current sink 210) around the second laser diode array (e.g., the MO laser diode array 304), which is configured in series with a second current sink (e.g., MO current sink 220). This enables operation of both the first and second laser diode arrays 202, 304, while simultaneously drawing different current amplitudes through each diode array from a common potential source. In the example illustrated in FIG. 3, a first current of $I_{PA}+I_{MO}$ is drawn through the PA laser diode array 202, while a different current of Imo is drawn through the MO laser diode array 304, despite both diode arrays 202, 304 being series coupled.

A more detailed schematic diagram of an embodiment of the MO current sink 220 is shown in FIG. 4. The MO current sink topology 220 and the PA current sink topology 210 can be identical. Thus, a single schematic is shown for the MO current sink. The circuit 220 includes a controllable current sinking device Q4 in electrical communication with the master oscillator diode array 304 (FIG. 3), and configured to draw or otherwise "sink" a controllable current $I_{MO}$ therethrough. In the illustrative embodiment, the current sinking device Q4 is a power MOSFET, such as device model no. IRFP4368PbF, commercially available from International Rectifier, of El Segundo, Calif. The example current sinking device Q4 can sink up to 350 Amperes of drain-to-source current $I_{DS}$ under the control of a gate-to-source voltage $V_{GS}$. For example, at a junction temperature of 25° C., $I_{DS}$ is about 100 Amperes for $V_{GS}$ of about 4.6 Volts and about 200 Amperes for $V_{GS}$ of about 4.9 Volts.

The current sink 220 includes a gate driving circuit in electrical communication with a gate terminal (G) of the current sinking device Q4. The gate driving circuit includes an integrator at U3B and a current sense differential amplifier at U5A connected to produce a closed loop, low-side current sink (the implementation can be either low-side or high-side). In a high-side configuration, the current sink would be arranged at the anode of MO diode 304. Once again, at least one advantage of high-side current drive is if the MO or PA laser diode array 202, 304 is inadvertently shorted to ground, the expensive laser diodes are protected. The cost of high-side drive is additional complexity, when compared to the low-side current sink approach.

In the example embodiments, the integrator U3B is model no. LM6172, commercially available from National Semiconductor Corp. of Santa Clara, Calif. A non-inverting input (+) of the integrator at U3B is in electrical communication with a controllable SPST switch U8. In the example embodiment, the switch U8 is an iCMOS SPST switch model no. ADG1401, commercially available from Analog Devices, Inc. of Norwood, Mass. In the example embodiment, the switch U8 is normally closed (e.g., DD_FIRE2 being a logical 1), which connects the non-inverting input to a low voltage level (e.g., −0.6 Volts or N_0.6V2) and turns the current sink off. The control input of the controllable switch U8 is in electrical communication with a first signal input 222 (e.g., DD_FIRE2). In response to a suitable control (e.g., DD_FIRE2 being a logical 0), the switch U8 is opened, removing the low voltage reference of −0.6 Volts from the non-inverting input and allowing the input signal 223 (e.g., I_SET2) to control the amount of current delivered by the current sink servo loop (e.g., 50 amps per volt in this particular example shown in FIG. 4).

The non-inverting input (+) of the amplifier U3B is in further electrical communication with a second signal input 223 through a resistive divider network including two resistors R44, R45. It is worth noting here that any device values, such as the resistance of R44 and R45, included herein are provided by way of illustrative example only and are not meant to otherwise limit the selection of other values, ranges, and devices. When this input is varied and the input signal 222 to U8 is a logic zero, the output of the closed loop current sink circuit generates a current that is proportional to the current sense resistor (R53); the gain of the differential amplifier at U5A (determined at least in part according to the values of R49 and R52), the voltage divider network (R44 and R45), and the magnitude of the voltage. In the illustrative example, the formula in amps-per-volt is: I/V in amps/volt=[(R52)×(R45)]/[(R49)×(R53)×(R45+R44)]. Where the "V" input is the I_SET2 voltage 223.

The inverting input (−) of the integrator U3B is in electrical communication with an output of a current monitoring circuit 225, and a positive supply voltage (e.g., +15 Volts), connected through a suitable pull-up resistor R42. An output of the integrator U3B is coupled to the inverting input through an R-C circuit including feedback resistor R43 in series with capacitor C29. The capacitor C29, at least in part, configures the device U3B as an integrator, while R43 in combination with C29, at least in part, creates a "Laplace zero" for servo-loop compensation of the current sink. The R-C combination R43, C29 is shunted by a diode CR2 arranged with its cathode coupled to the amplifier output. The shunting diode CR2 in combination with pull-up resistor R42 form a negative clamp that guarantees that Q4 comes up in the "off" state. The shunting diode CR2 clamps the integrator U3B output and thus the current sinking device's Q4 gate to about −0.7V. With the particular arrangement, an output of the amplifier U3B, when "fired" (e.g., when the switch U8 is open circuit) follows the integrated difference between one half of the second input signal 223 (I_SET2) and an output of the current sensing circuit 225 or the I_SENSE2 signal 228. The amplifier output voltage is coupled to the gate terminal (G) of the current sinking device Q4 through a series resistor R48. The series resistor R48 isolates the integrator U3B from the high capacitance of Q4's gate and prevents unwanted ringing of the current sink servo loop.

In this arrangement, the current sinking device Q4 will sink or otherwise conduct a controllable current when the first signal input 222 (DD_FIRE2) is a logic input of 0. A value of gate driving voltage is determined by the integrated difference between the current sense output 228 (I_SENSE2) and one half the second input signal 223 (I_SET2). The second input signal 223 (I_SET2) can be substantially constant, such that the Drain-to-Source current through the current sinking device Q4 is a pulse output corresponding to the first signal input 222 (DD_FIRE2). Alternatively or in addition, the Drain-to-Source current through the current sinking device Q4 follows one half of the second input signal 223 (I_SET2), while the first signal input is active. When the second signal varies during time periods when the first input signal 222 (DD_FIRE2) is active, the output gate voltage will vary in a corresponding manner, such that the current sink current $I_{DS}$ will also vary in a like manner. In at least some embodiments, a similar circuit can be provided for the first current sink 210 (PA current sink).

In the illustrative example, the voltage monitoring circuit 225 includes a precision high-current sensing resistor R53 connected in series with a source terminal (S) of the current sink Q4. In the example embodiments, the sensing resistor R53 has a value of 0.0022 Ohms, with a tolerance of 1%, provided by model no. SMV-R0022-1.0, commercially available from ISOTEK Corp. of Swansea, Mass. A current $I_{MO}$ drawn through the sensing resistor R53 will give rise to a corresponding voltage drop. The voltage drop is applied to input terminals of a second, precision differential amplifier U5A. In the illustrative embodiment, the second amplifier U5A is model no. OP467GS, commercially available from Analog Devices Inc., of Norwood, Mass.

The inputs to the current sense differential amplifier U5A are coupled through a resistor network as shown. Namely, a first side of the sensing resistor R53 is coupled to a non-inverting input (+) of the differential amplifier U5A through a series resistor R51 and a shunt resistor R50. An opposite side of the sensing resistor R53 is coupled to the inverting input (−) through a series resistor R52. A feedback resistor R49 is coupled between an output of the amplifier U5A and the inverting input. Resistors R49 through R52 form a differential amplifier topology with opamp U5A. The current to voltage gain in the illustrative example is I/V=(R52)/[(R49)×(R53)] amps/volt. Thus, for every 100 amps of current flowing through the sensing resistor R53, the current sense output 228 (I_SENSE2) will be 1.0V for the particular embodiment shown in FIG. 4. Accordingly, an amplifier output voltage follows a voltage drop across the precision resistor. In at least some embodiments, the output voltage indicative of the drain-to-source current $I_{DS}$ is provided as an analog current sense signal 228 (I_SENSE2). Further signal conditioning (e.g., amplification or buffering) can be applied to the amplifier output as necessary.

Figure 5:
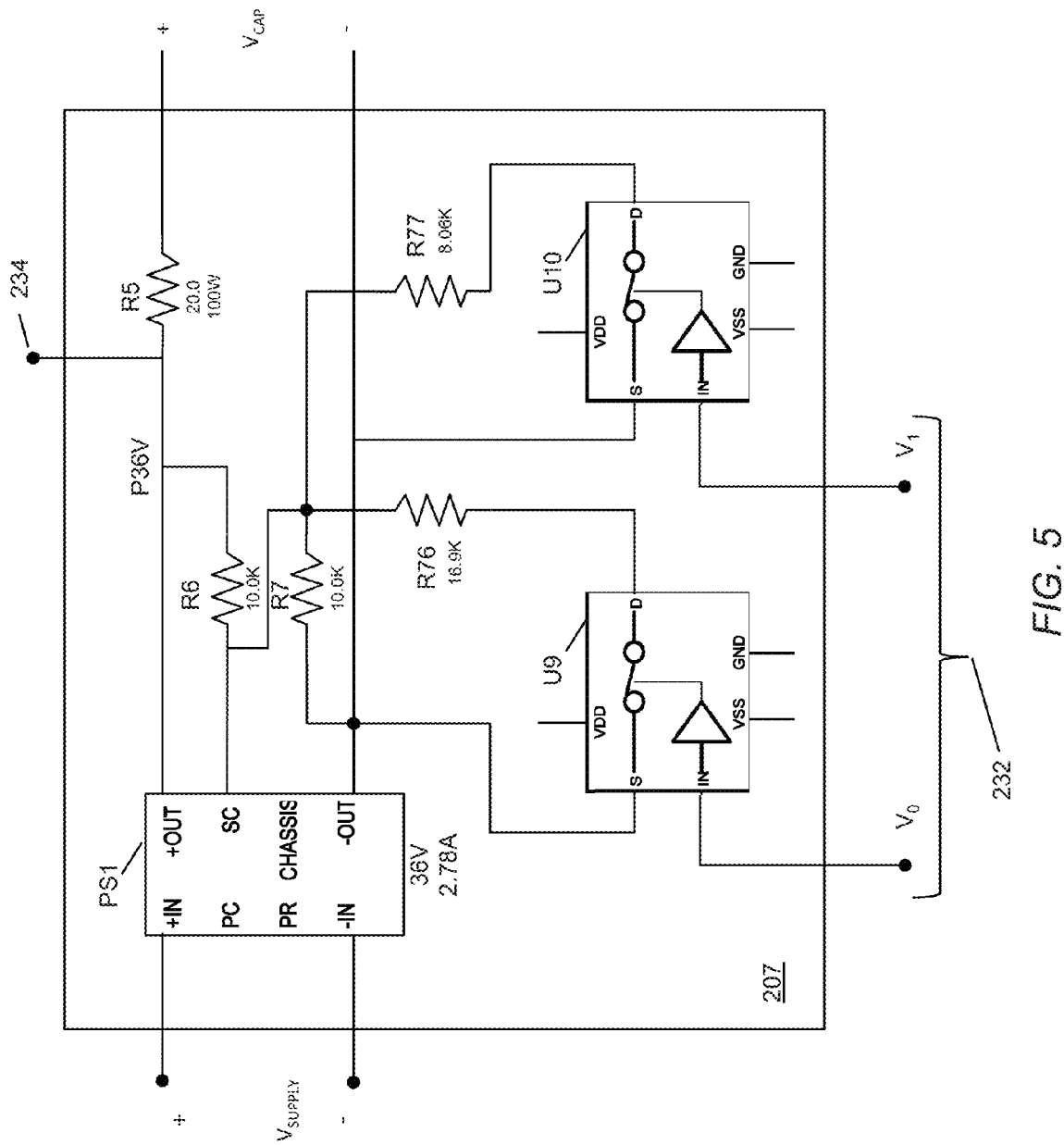
FIG. 5 illustrates a schematic diagram of an embodiment of a charge storage circuit portion of a multi-stage laser diode driver with digital control of the output voltage.

A schematic diagram of an embodiment of a storage capacitor charging circuit 207 of a multi-stage laser diode driver is shown in FIG. 5. The circuit includes a power module PS1 coupled between an external power supply $V_{SUPPLY}$ and the storage capacitor 206 $V_{CAP}$ (FIGS. 2, 3). In the illustrative example, the power module PS1 is a DC-DC converter, model no. V28C36T100BL, commercially available from Vicor Corp. of Andover, Mass. In this example, the power module PS1 is operable for an input voltage ranging from 9 to 36 Volts. A positive output voltage is coupled to a positive side of the storage capacitor 206 through a relatively high-power series resistor R5. In the illustrative example, the series resistor R5 has a value of 20.0 Ohms and is rated for power dissipation of about 100 Watts. A charging time constant τ of the storage capacitor is determined at least in part by the capacitor value (e.g., 30,000 μFarads) and the series resistor R5. Here, τ=RC, or about 0.6 sec. After initial turn on and full charge of $V_{CAP}$; R5 is shunted by a much smaller resistor (e.g., 1.00 ohm—not shown), so that $V_{CAP}$ can be much more quickly charged to its full voltage. This allows for operation up to a pulse repetition frequency (PRF) of 30 Hz.

An adaptive resistive network is coupled to a secondary control terminal SC of the power module PS1. In particular, a voltage at the secondary control terminal SC can be varied to "trim" or otherwise adjust the value of the output voltage of the supply module PS1 up or down, as may be necessary. In the illustrative embodiment, a first resistor R6 is coupled between a positive (+OUT) output terminal of the power module PS1 and the secondary control terminal SC. R6 can be installed, for example, when it is desired to trim up from the nominal output of PS1. If it is not required to trim up, R6 need not be installed. A second resistor R7 is coupled between the secondary control terminal and the negative (−OUT) output terminal of the power module PS1. R7 can be installed, for example, when it is desired to trim down from the nominal output of PS1. If it is not required to trim down, R7 need not be installed. Two shunt resistors R76, R77 are provided in parallel with the second resistor R7. In particular, the shunt resistors R76, R77 can be selectively shunted individually or collectively with the second resistor R7 in order to vary the resistance value between the secondary control terminal SC and the negative output terminal.

Application of either shunt resistor R76, R77 is obtained by selective control of SPST switches U9 and U10. Each switch U9, U10 is independently controllable by a respective input signal $V_0$, $V_1$. In the example embodiment, switches U9, U10 are also model no. ADG1401. The switches U9, U10 are closed for a logic input of 1 and opened for a logic input of 0. In at least some embodiments, an output monitor terminal 234 is provided for monitoring an output voltage of the power module PS1. The voltage at the output monitor terminal 234 can be provided as an input to the controller 230 (FIG. 2, 3) as an indication of the power module output voltage level. If the output voltage is determined to be too low or too high, suitable adjustment can be made by way of TTL control terminals $V_0$, $V_1$, for example, from Controller 230. It should be noted that the coarse adjustment provided by U9 and U10 in the embodiment shown in FIG. 5, could easily be replaced by a "digital potentiometer" controlled, for example, by a FPGA contained in Controller 230. This would in turn give a much finer adjustment of the capacitor voltage ($V_{CAP}$) from the power module PS1. The $V_{CAP}$ voltage is adjusted for the purpose of minimizing the voltage drop across the current sink MOSFETs Q4 (FIG. 4), while simultaneously keeping these same MOSFETs Q4 in their linear region. Efficiency is maximized by minimizing the power consumed by the current sink pass element (power=(Vds)×(Ids)). This concept can be enhanced by monitoring the temperature of both the Laser Diodes (204 and 304 in FIG. 3) and the temperature of the circuit board near the storage capacitor. By monitoring these two temperatures PS1 can be adjusted to compensate for variations in the equivalent series resistance (ESR) of the storage capacitor and variations in the voltage drop of the Laser pump diodes at 204 and 304. By keeping the drain-to-source voltage Vds of the MOSFET Q4 close to about +0.7V, maximum efficiency can be achieved.

Figure 6:
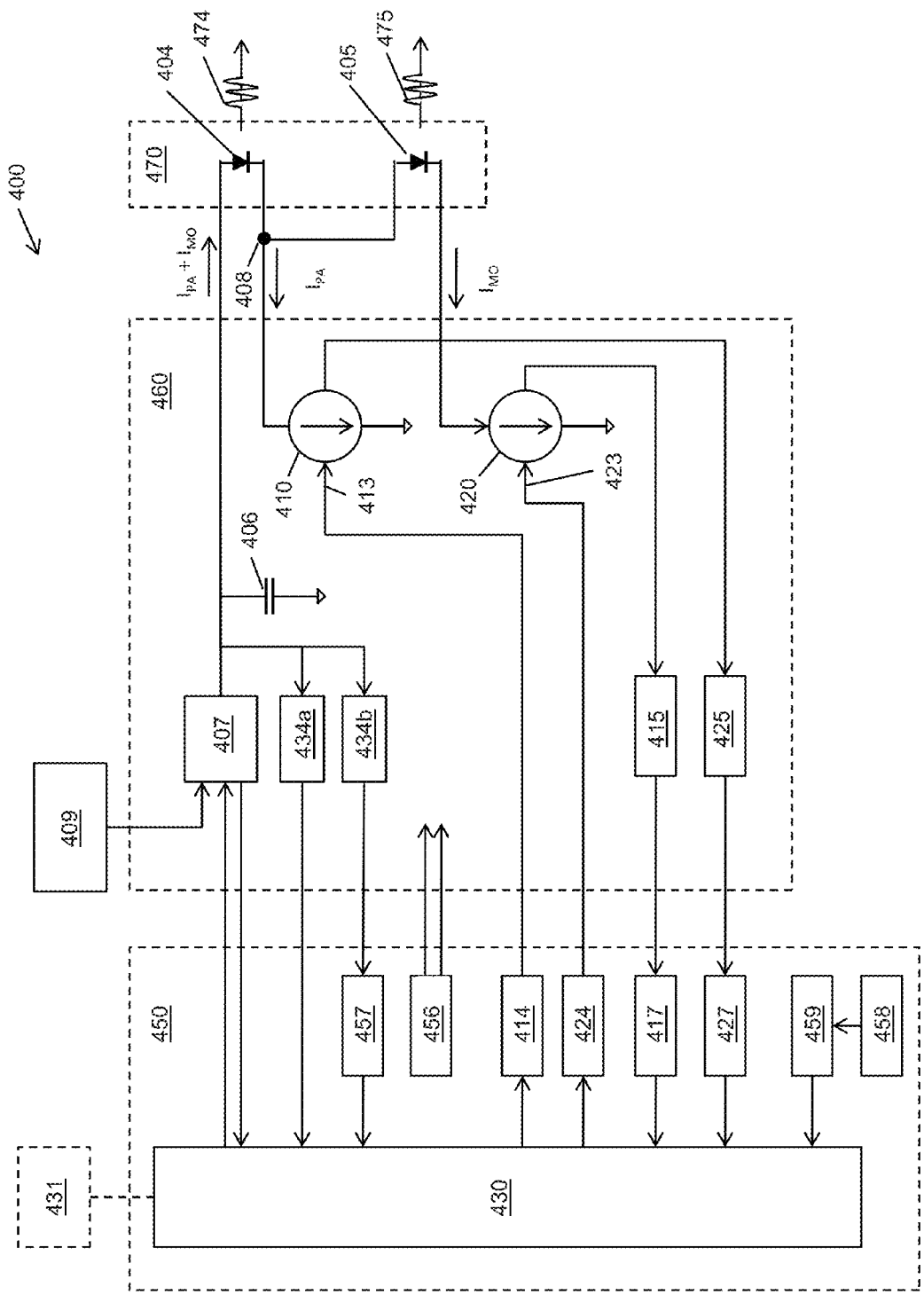
FIG. 6 illustrates a block diagram overview of an embodiment of a modularized multi-stage laser diode driver for driving the MO and PA light-emitting diode arrays for a planar waveguide laser.

A block diagram overview of an embodiment of a modularized multi-stage laser diode driver is shown in FIG. 6. The illustrative embodiment includes three modules: a control logic module 450; a diode drive module 460; and an optical module 470. A separate power source 409 is illustrated as not being included in any of the driver modules. The power source 409 can be any suitable power source capable of sourcing sufficient current and voltage to charge a supply capacitor 406. Examples include batteries, facility power, other ac and/or dc power supplies. The power may be alternating current, direct current, or a combination of alternating and direct currents.

The particular arrangement and number of modules 450, 460, 470, as well as the division of circuits and/or functions among the modules is provided by way of example. It is contemplated that other modular arrangements are possible. The modules can be separate and interconnected. For example, each of the three modules 450, 460, 470 can be provided in a separate chassis and/or housing, One or more interconnects, such as cables, can be provided between the modules. In some embodiments two or more of the modules 450, 460, 470 may be included in a common housing or chassis. Interconnection between modules can also be accomplished by interconnects configured on the modules themselves, for example, along a common backplane, or as a motherboard-daughterboard arrangement.

The optical module 470 includes a first array of one or more pump diodes 404, configured to receive a first pump or drive current, e.g., $I_{PA}+I_{MO}$. The first array of pump diodes 404 is configured to emit pump light 474 in response to the drive current. The pump light 474 is directed toward the Power Amplifier (PA) optical gain medium (not shown) and configured to pump ions of the gain medium to a predetermined elevated energy state through well known techniques. A second array of one or more master oscillator diodes 405 is configured to receive a second drive current, e.g., $I_{MO}$, having a magnitude that is at least nominally equal to or less than the first drive current. The second array of master oscillator diodes 405 is also configured to emit light 475 in response to the drive current. The master oscillator light 475 is also directed toward a completely separate Master Oscillator optical gain medium (not shown) and configured to stimulate emission of gain medium ions pumped to the elevated energy state. The output light energy from the Master Oscillator (MO) gain medium is used to drive the Power Amplifier (PA) gain medium, which amplifies the light from the MO gain medium. Effectively, the master oscillator seed light (not shown) is amplified by the PA optical gain medium.

The diode drive module 460 includes a storage capacitor 406, a capacitor charger 407, and first and second current sinks 410, 420. The capacitor charger 407 is in electrical communication between the external power source 409 and the storage capacitor 406, converting or otherwise conditioning electrical power from the power source to charge the storage capacitor 406. The storage capacitor 406 is in further communication with a series combination of the first and second arrays of diodes 404, 405. The first current sink 410 is coupled to a circuit node 408 disposed between the first and second arrays of diodes 404, 405. The node 408 can be provided in one of the modules (e.g., the diode drive module 460, the optical module 470), or along an interconnecting cable or trace interconnecting both modules 460, 470. The first current sink 410 is in communication between the circuit node 408 and a return of the storage capacitor 406 (e.g., ground). The second array of diodes 405 is positioned between node 408 and the second current sink 420. The second current sink 420 is also in electrical communication with the return of the storage capacitor 406 (e.g., ground).

One or more of the first and second current sinks 410, 420 can include or otherwise be in electrical communication with a respective current monitor circuit 415, 425. The current monitor circuits are configured to provide an indication of the current level being drawn through a respective current sink 410, 420. In at least some embodiments of the diode drive module 460, additional circuits can be provided, such as a capacitor charge indication circuit 434a, providing an indication whether the storage capacitor is charged 406, for example, to a predetermined charge value. Alternatively or in addition, the diode drive module 460 can include a storage capacitor voltage monitoring circuit 434b.

In the illustrative example, the control logic module 450 includes a controller circuit or module 430. The controller 430 can include or otherwise be implemented by programmable semiconductor devices that are based around a matrix of configurable logic blocks connected via programmable interconnects, generally referred to as field programmable gate arrays (FPGAs). Such devices are commercially available, for example, from XILINX, Inc. of San Jose, Calif., for example, the Virtex-6Q family of devices. Such devices can be configured through known techniques to implement control and monitoring of various functions, such as those described herein in relation to operation of the laser diode drivers 400. Also shown in phantom is a separate or auxiliary controller 431, such as a computer that can be included in at least some embodiments.

In some embodiments, as shown, the control logic module 450 includes one or more ADCs (Analog to Digital Converters). In the illustrative embodiment, ADCs 417, 427 are provided to convert a respective sensed analog current value to a digital value for further processing by the controller module

430. Another ADC 457 can be provided to convert an analog value of the sensed storage capacitor voltage to a digital value. Likewise, any other sensors providing analog output signals, such as a temperature sensor 458, can be coupled to the controller module 430 through a respective ADC 459. Some temperature sensors have a serial digital output without a need for the ADC 459.

Similarly, control logic module 450 can include one or more digital-to-analog converters (DACs) to convert any digital outputs provided by the controller module 430 to analog values, when appropriate. Examples include the DACs 414, 424 provided to convert respective current sink drive signal from digital value to an analog voltage level suitable for controlling the respective current sink 410, 420 with analog control signals 413, 423 respectively.

Figure 7:
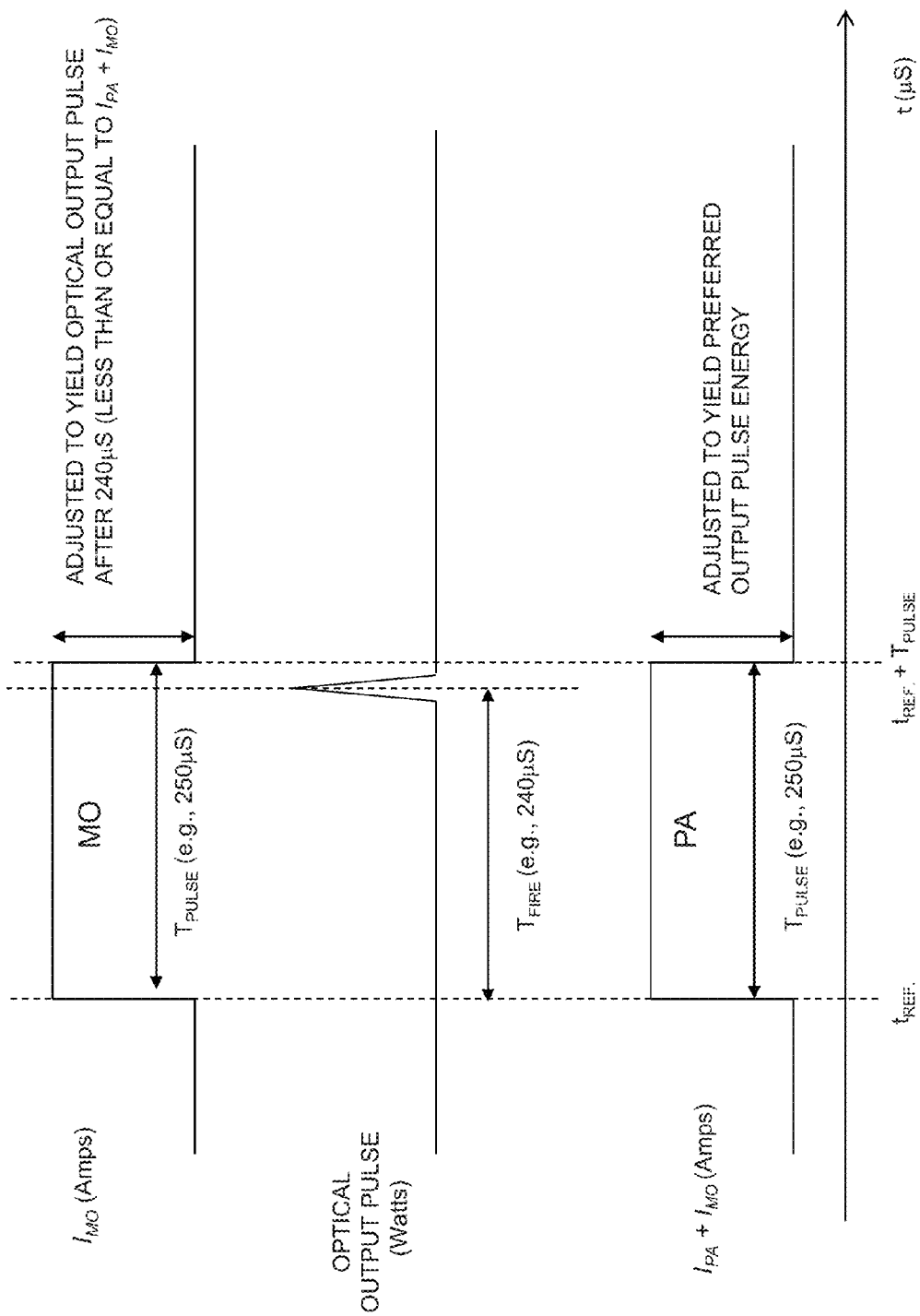
FIG. 7 illustrates a series of traces of representative current sink driver pulses aligned with an optical output pulse from the PA gain medium.

A series of traces of representative current driver pulses aligned with an optical output pulse is shown in FIG. 7. A first waveform is illustrated, indicative of a current pulse $I_{PA}+I_{MO}$ as may be applied to the PA laser diode array of a MOPA configuration (e.g., FIG. 3). The example pulse has a leading edge at a reference time $t_{ref}$ and lasts for a pulse duration time $T_{PULSE}$. The amplitude of the pulse can be adjusted according to values of one or more of the individual currents $I_{PA}$, $I_{MO}$. In at least some embodiments, the pulse amplitude is set to a level to yield a preferred output pulse energy of an optical amplifier pumped by laser diode array driven by an electrical current corresponding to the first waveform.

A second waveform is illustrated, indicative of a current pulse $I_{MO}$ as may be applied to the MO laser diode array of a MOPA configuration (e.g., FIG. 3). The example pulse has a coincident leading edge at $t_{ref}$ and lasts for a pulse duration time $T_{PULSE}$. The amplitude of the pulse can be adjusted according to the value of $I_{MO}$. In at least some embodiments, the pulse amplitude is set to a level to yield a preferred output pulse at a fire time $T_{fire}$, measured relative to $T_{REF}$. A third waveform is indicative of an optical output of a MOPA gain medium excited by laser diodes driven by electrical currents of the first and second traces. In the illustrative embodiment, the fire time is approximately 240 μs. In at least some embodiments, there can be a jitter associated with the fire time, such that the pulse is not consistently reproduced at $T_{fire}$ with respect to $T_{REF}$, but rather to a value differing by a jitter time.

Figure 8:
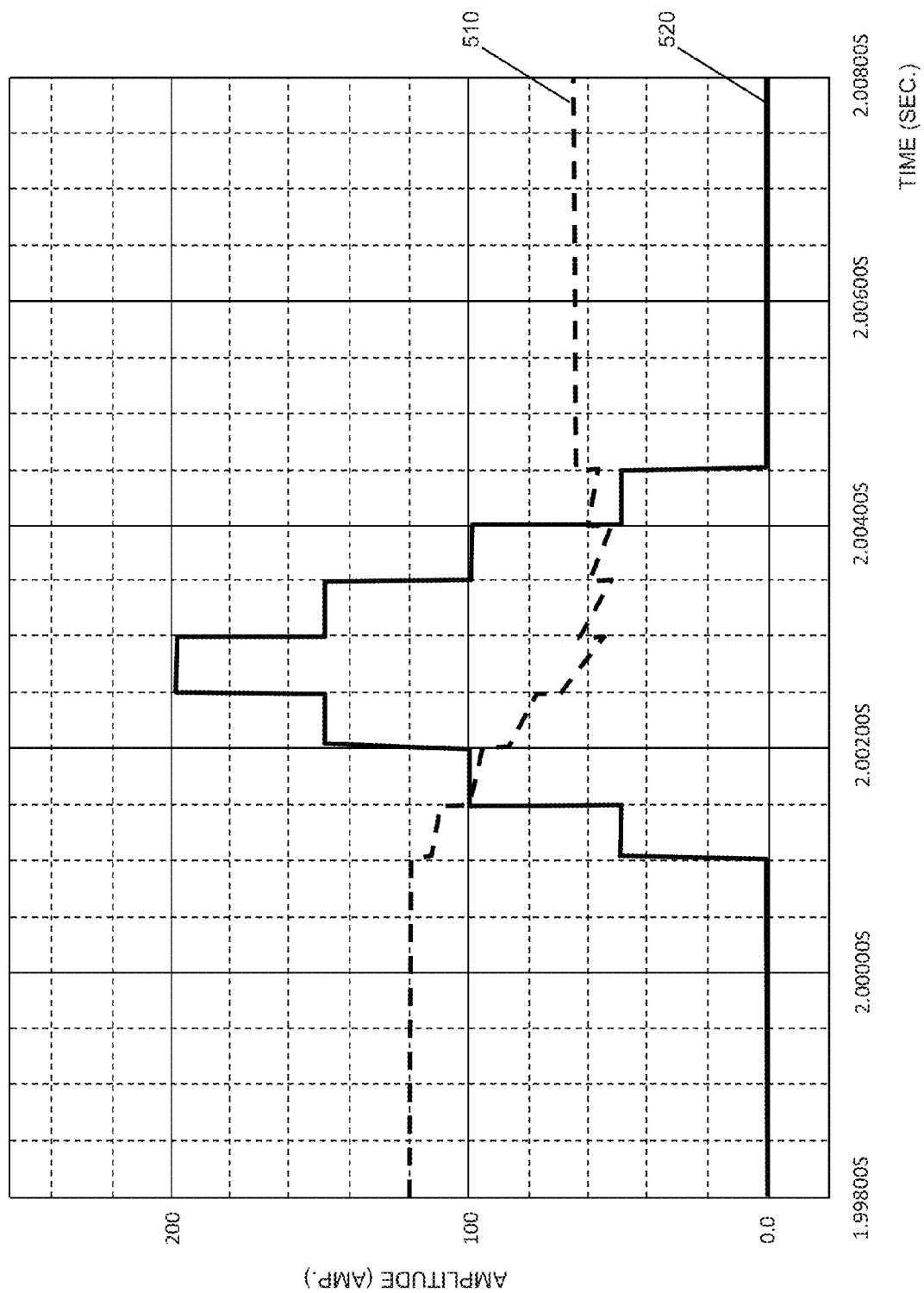
FIG. 8 illustrates an example of a non-rectangular current driver pulse and corresponding storage capacitor voltage obtainable by the types of multi-stage laser diode drivers described herein.

An example non-rectangular current driver pulse 520 and corresponding storage capacitor voltage 510 obtainable by the types of multi-stage laser diode drivers described herein is shown in FIG. 8. The current driver pulse 520 has a base width of 3500 μs, a peak amplitude of 200 Amps, and varies by 50 Amps steps, each 500 μs wide, providing a generally stepwise triangular shape. The storage capacitor voltage starts out at a maximum value, then decreases linearly with each step in which current is drawn, to a lower value. The storage capacitor voltage is charged once again to the maximum value for subsequent pulses. Such a drive current pulse can be obtained for example, by varying a current-level control signal, during an active pulse period.

Figure 9:
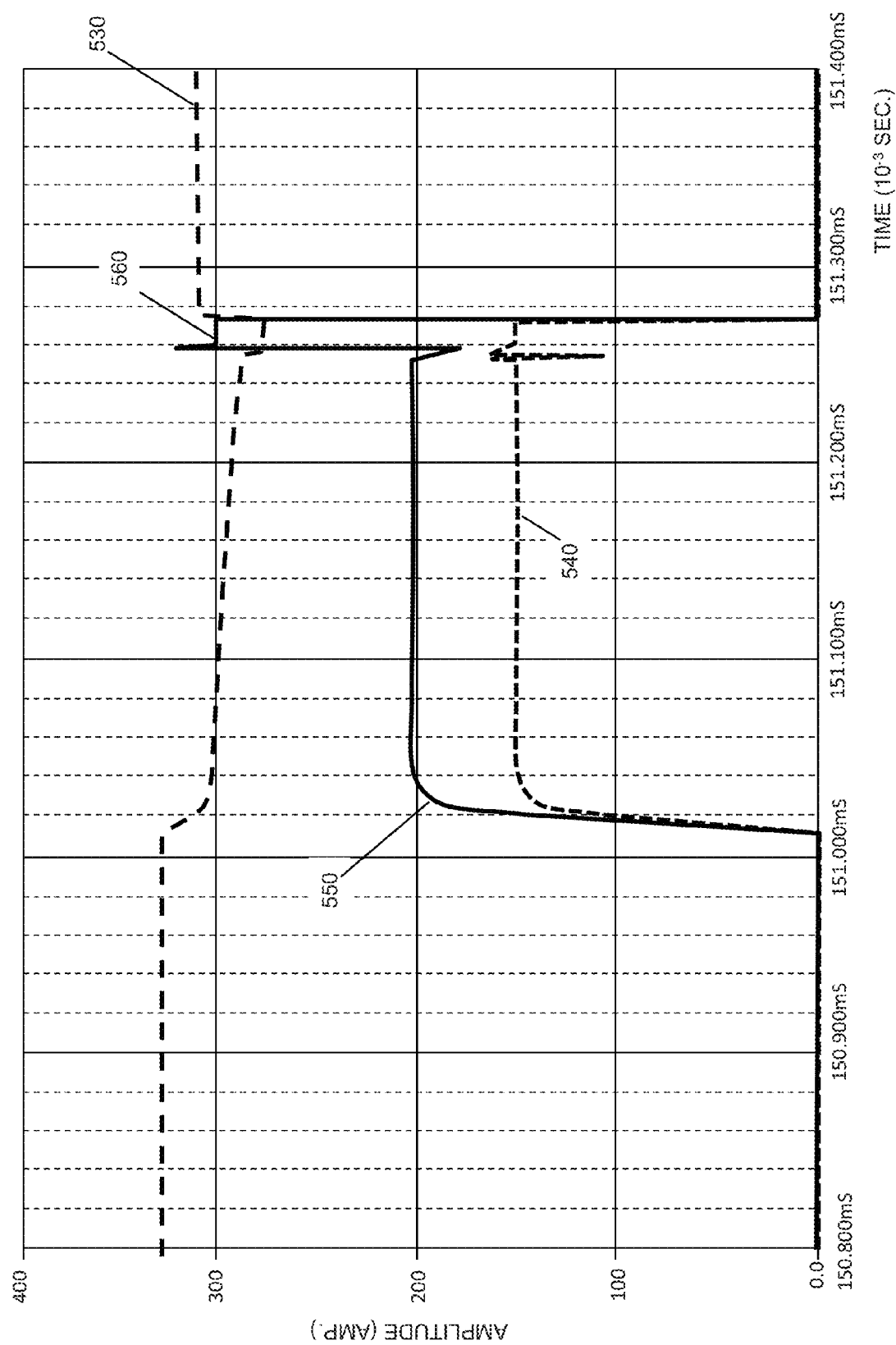
FIG. 9 illustrates another example of non-rectangular current driver pulses and corresponding storage capacitor voltage obtainable by the types of multi-stage laser diode drivers described herein.

Another example of non-rectangular current driver pulses and corresponding storage capacitor voltage obtainable by the types of multi-stage laser diode drivers described herein is shown in FIG. 9. More particularly, a first waveform 550, 560 is indicative of a PA laser diode current pulse (e.g., $I_{MO}+I_{PA}$). The pulse rises sharply at about 151 ms to a value of about 200 Amps. The pulse remains substantially level over the remaining pulse width, except for a brief period at the end of the pulse, during which the pulse amplitude rises substantially. In the illustrative example, the total pulse width is about 255 μs, having an initial amplitude of 200 Amps for approximately the first 200 μs, then rising to about 300 Amps for approximately the final 15 μs. A second waveform 540 is indicative of a master oscillator laser diode driving pulse (e.g., $I_{MO}$). The pulse rises sharply coincident with the first pulse, to a slightly lesser value of about 150 Amps. The pulse remains substantially level over the remaining pulse width of 255 us. Also shown is a representative waveform 530 of a storage capacitor voltage during discharge producing the first $(I_{MO}+I_{PA})$ current pulse and the second $(I_{MO})$ current pulse.

The complex shape of the first pulse can be produced by the arbitrary waveform generation capabilities of the laser driver circuits described herein. Beneficially, such a current spike 560 can be used to induce an optical pulse output from the gain medium at a more precise time corresponding to the current peak (e.g., at 240 μs) (thus reducing pulse to pulse jitter). This method of Q-switching is called a "Pump-triggered (composite pulse) Saturable Absorber". Such a sudden increase in laser diode drive current produces a corresponding increase in laser diode output toward the gain medium of a MOPA configuration, inducing an optical pulse. Such a pulsing scheme can be used to simplify circuitry, for example, by eliminating a bleaching diode and bleaching diode driver circuitry.

Figure 10:
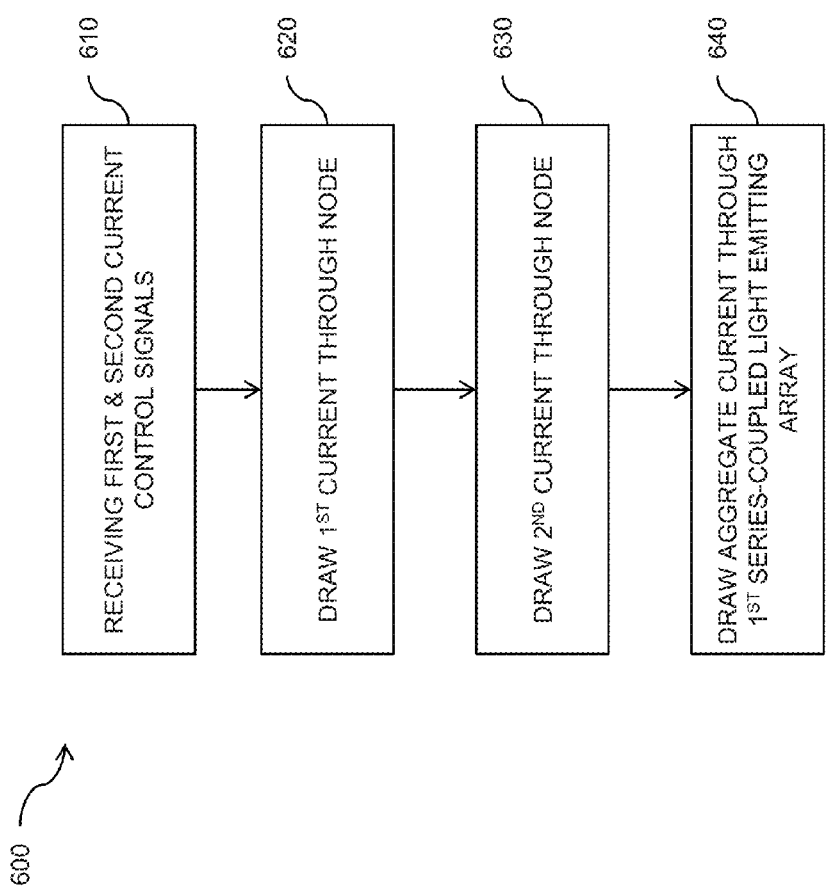
FIG. 10 illustrates a process 600 for driving a first light-emitting array.

FIG. 10 illustrates a process 600 for driving a first light-emitting array. The process includes receiving first and second current control signals at 610. A first current is drawn from a common potential source through a current node at 620. The first current is drawn in response to the received first current control signal. A second current is drawn from the common potential source through the current node at 630. The second current is drawn in response to the received second current control signal. In particular, the first and second currents are arranged in parallel with respect to each other. An aggregate current is drawn through a first light-emitting array at 640. The aggregate current is determined substantially by a combination of the first and second currents. The light-emitting array emits light in response to the aggregate current drawn therethrough.

Although the first and second currents are described as being drawn from a common potential source, the particular direction of the current is determined by one or more of the light-emitting array and the common potential polarity. For example, current can be "drawn" from a positively biased common potential source through a forward biased junction of a semiconductor light-emitting array. Likewise, current can be "pushed" to a negatively biased common potential source through a forward-biased junction of a semiconductor light-emitting array.

In some embodiments, the process further includes receiving a current-enable signal, for example, having at least two states corresponding to active and standby, and receiving a current-level setting signal. The current-level setting signal determines at least one of the first and second current control signals in response to the received current-enable and current-level setting signals. The respective one of the first and second currents is selectively drawn responsive to the current-enable signal being in the active state.

In some embodiments, the process further includes emitting light from a second light-emitting array in response to the first current. For example, in a circuit arrangement, such as the embodiment shown in FIG. 3, the second light-emitting array (e.g., at least one laser diode) will emit light when a first current $I_{MO}$, of an appropriate magnitude is drawn through the forward-biased junction of the laser diode.

In some embodiments, the process further includes receiving a current-enable signal comprising at least two states corresponding to active and standby; receiving a current-level setting signal; determining at least one of the first and second current control signals in response to the received current-enable and current-level setting signals, the respective one of the first and second currents being selectively drawn responsive to the current-enable signal being in the active state.

In some embodiments, the process further includes pumping a laser gain medium by light emitted from at least one said light-emitting arrays.

In some embodiments, the received current-level setting signal varies while the current-enable signal is in the active state.

In some embodiments, the current-level setting signal comprises a momentary peak configured to induce a momentary peak output of at least one said series connected, light-emitting arrays adapted to optically excite the gain medium being pumped, thereby providing synchronization in the optical excitation with respect to the laser output.

Any of the light-emitting devices described herein can be any suitable light source for pumping or seeding an optical power amplifier. Such devices include semiconductor laser diodes, flash lamps, light emitting diodes and the like.

The number of current sinks and control terminals for said current sinks can be three, four, five, or more current sinks in parallel to increase aggregate current capacity and to improve overall aggregate reliability. Only two current sinks will be discussed in the remainder of this document for simplicity. Additionally, the current sinks could just as easily been designed as current sources located between the common potential source and the top first light-emitting array.

Any of the circuits described herein can be fabricated as integrated circuits having one or more electrically conductive layers (e.g., traces and ground planes) separated from each other by one or more insulting layers. Such circuits can be formed on a semiconductor substrate, such as Silicon, Germanium, III-V materials, such as Gallium-Arsenide (GaAs), and combinations of such semiconductors. In some embodiments, the circuits are formed as a monolithic integrated circuit. Alternatively, circuits can be formed as multi-chip assemblies.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A multi-stage laser drive circuit configured to draw current from a common potential source, comprising:
    a current node;
    a first light-emitting array in electrical communication between the common potential source and the current node;
    a first linear current sink in electrical communication with the current node, the first linear current sink having a first control terminal and configured to draw a selected first current from the common potential source, through the current node, in response to a respective first current control output signal received at the first control terminal;
    a second linear current sink in electrical communication with the current node and in a parallel arrangement with respect to the first current sink, the second linear current sink having a second control terminal and configured to draw a selected second current from the common potential source, through the current node, in response to a respective second current control output signal received at the second control terminal; and
    a second light-emitting array in electrical communication between the current node and the second linear current sink;
    whereby the selected first and second currents are drawn through the first light-emitting array from the common potential source while the selected second current is simultaneously drawn through the second light-emitting array from the common potential source; and
    whereby the first and second light-emitting arrays are configured to emit light in response to the currents respectively drawn therethrough.

2. The multi-stage laser drive circuit of claim 1, further comprising at least one current-drive circuit having a current-enable input, a current-level setting input and a current control output in electrical communication with one of the first and second control terminals, the current-drive circuit configured to selectively provide a respective current control output signal in response to a signal received at the current-enable input, the respective current control output signal, when provided, being further determined by a signal received at the current-level setting input.

3. The multi-stage laser drive circuit of claim 1, wherein at least one of the first and second light-emitting device comprises an optical pumping source.

4. The multi-stage laser drive circuit of claim 1, wherein at least one of the first and second light-emitting device comprises a Laser diode.

5. The multi-stage laser drive circuit of claim 1, wherein at least one of the first and second current sinks comprises a semiconductor device.

6. The multi-stage laser drive circuit of claim 5, wherein the semiconductor device is a metal-oxide-semiconductor field effect transistor (MOSFET) device.

7. The multi-stage laser drive circuit of claim 1, further comprising at least one current-drive circuit having a current-enable input, a current-level setting input and a current control output in electrical communication with one of the first and second control terminals, the current-drive circuit configured to selectively provide a respective current control output signal in response to a signal received at the current-enable input, the respective current control output signal, when provided, being further determined by a signal received at the current-level setting input.

8. The multi-stage laser drive circuit of claim 7, further comprising a controller in electrical communication with the current-enable and current-level setting inputs of the at least one current drive circuit, the controller configured to provide a current-enable signal to the current-enable input and a current-level setting signal to the current-level setting input.

9. The multi-stage laser drive circuit of claim 8, further comprising at least one current sensing device in electrical communication with a respective one of the first and second current sinks and with the controller, the current sensing device configured to provide a respective output signal indicative of a respective current drawn therethrough.

10. A method for driving light-emitting arrays, comprising:
    receiving first and second current control signals;

drawing, by a first linear current sink, a selected first current from a common potential source through a current node in response to the received first current control signal;

drawing, by a second linear current sink, a selected second current from the common potential source through the current node in response to the received second current control signal, the first and second currents being in parallel with respect to each other; and drawing the selected first and second currents from the common potential source through a first light-emitting array simultaneously while drawing the selected second current from the common potential source through a second light emitting array, wherein the first and second light-emitting arrays emit light in response to the respective currents drawn there through.

11. The method of claim 10, further comprising:

receiving a current-enable signal comprising at least two states corresponding to active and standby;

receiving a current-level setting signal;

determining at least one of the first and second current control signals in response to the received current-enable and current-level setting signals, the respective one of the first and second currents being selectively drawn responsive to the current-enable signal being in the active state.

12. The method of claim 10, further comprising emitting light from a second light-emitting array in response to the second current.

13. The method of claim 12, further comprising:

receiving a current-enable signal comprising at least two states corresponding to active and standby;

receiving a current-level setting signal;

determining at least one of the first and second current control signals in response to the received current-enable and current-level setting signals, the respective one of the first and second currents being selectively drawn responsive to the current-enable signal being in the active state.

14. The method of claim 13, further comprising pumping a laser gain medium by light emitted from at least one of said first and second light-emitting arrays.

15. The method of claim 13, wherein the received current-level setting signal varies while the current-enable signal is in the active state.

16. The method of claim 15, wherein the current-level setting signal comprises a momentary peak configured to induce a momentary peak output of at least one of said first and second light-emitting arrays adapted to optically excite the gain medium being pumped, thereby providing synchronization in the optical excitation with respect to the laser output.

* * * * *

UNITED STATES PATENT AND TRADEMARK OFFICE
CERTIFICATE OF CORRECTION

PATENT NO. : 9,001,857 B2
APPLICATION NO. : 13/215873
DATED : April 7, 2015
INVENTOR(S) : Michael S. Lackey et al.

Page 1 of 1

It is certified that error appears in the above-identified patent and that said Letters Patent is hereby corrected as shown below:

On the Title Page

Item (72) Inventors, should read:
--Michael S. Lackey, Torrance, CA (US); Thomas H. Alford, Lomita, CA (US); Robert F. Stiffler, Lakewood, CA (US); David Filgas, Newbury Park, CA (US); Michael J. Ramirez, Torrance, CA (US)--

Signed and Sealed this
Twentieth Day of August, 2019

Andrei Iancu
*Director of the United States Patent and Trademark Office*